United States Patent
Choi et al.

(10) Patent No.: US 10,090,668 B2
(45) Date of Patent: Oct. 2, 2018

(54) BI-DIRECTIONAL TRANSMITTER/RECEIVER COMPRISING TEMPERATURE SENSOR AND DRIVING CIRCUIT COMPRISING THE SAME

(71) Applicant: FAIRCHILD KOREA SEMICONDUCTOR, LTD., Bucheon (KR)

(72) Inventors: Jinkyu Choi, Bucheon-si (KR); Wonhi Oh, Bucheon-si (KR); Kinam Song, Seoul (KR); Hyunsoo Bae, Incheon (KR); Samuell Shin, Guri-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/648,648

(22) Filed: Jul. 13, 2017

(65) Prior Publication Data

US 2017/0310101 A1    Oct. 26, 2017

Related U.S. Application Data

(63) Continuation of application No. 14/748,997, filed on Jun. 24, 2015, now Pat. No. 9,735,565.

(60) Provisional application No. 62/016,804, filed on Jun. 25, 2014.

(51) Int. Cl.
  H02H 5/04      (2006.01)
  G01K 7/00      (2006.01)
  H03K 17/56     (2006.01)

(52) U.S. Cl.
  CPC ............... H02H 5/047 (2013.01); G01K 7/00 (2013.01); H03K 17/56 (2013.01)

(58) Field of Classification Search
  CPC .................................. H92H 5/04; H02H 5/047
  USPC ..................................................... 361/103–104
  See application file for complete search history.

(56) References Cited

U.S. PATENT DOCUMENTS

2015/0318848 A1* 11/2015 Kandah ................... H02M 1/32
                                                           363/132

* cited by examiner

*Primary Examiner* — Dharti Patel
(74) *Attorney, Agent, or Firm* — AMPACC Law Group, PLLC

(57) ABSTRACT

A bi-directional transmitter/receiver according to an embodiment includes a pin connected with a main control circuit, a transistor connected with a first electrode to the pin, a Schmitt trigger which determines an output according to a voltage of the pin, and a temperature sensor which is connected to the pin and which senses temperature and outputs temperature information to the pin. A driving circuit for controlling switching operation of one or more switches includes a bi-directional transmitter/receiver.

10 Claims, 1 Drawing Sheet

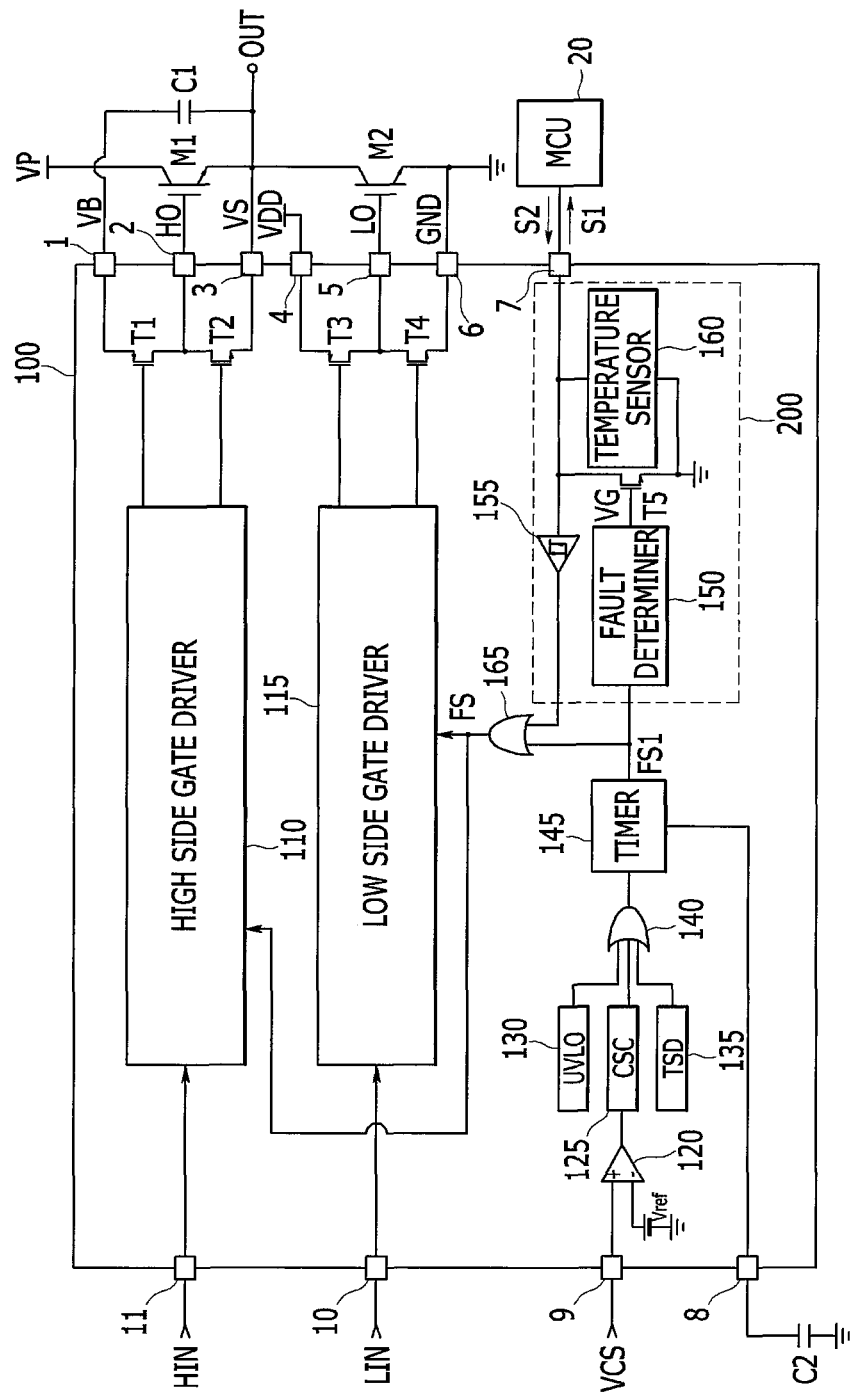

BI-DIRECTIONAL TRANSMITTER/RECEIVER COMPRISING TEMPERATURE SENSOR AND DRIVING CIRCUIT COMPRISING THE SAME

CROSS-REFERENCE TO RELATED APPLICATIONS

This application is a continuation of U.S. patent application Ser. No. 14/748,997, filed on Jun. 24, 2015, which claims priority from U.S. Provisional Application No. 62/016,804, filed on Jun. 25, 2014 with the United States Patent and Trademark Office, and Korean Patent Application No. 10-2015-0088635, filed with the Korean Intellectual Property Office on Jun. 22, 2015. The entire contents of the just-mentioned disclosures are incorporated herein by reference.

BACKGROUND

(a) Technical Field

Embodiment relates to a bi-directional transmitter/receiver and a driving circuit comprising the same.

(b) Description of the Related Art

A package having an integrated circuit (IC) to drive switches includes an NTC thermistor which senses temperature, and at least one pin to transmit the information sensed at the NTC thermistor to a control circuit that controls power supply device. The above can be the cause of increased price of the package.

Further, separate pin(s) may be necessary in order to receive control signals from the control circuit to the package.

SUMMARY

Embodiment proposes a bi-directional transmitter/receiver which can sense the temperature of a package, transmit internal temperature information, and receive an external control signal, without causing price rise, and a driving circuit having the same.

According to an embodiment, a driving circuit for controlling switching operation of one or more switches, which is connected to a main control circuit through a pin, is provided, including a logic operator which determines an output to activate protection operation, and a bi-directional transmitter/receiver which may include a temperature sensor to sense temperature, in which the bi-directional transmitter/receiver may control a voltage of the pin according to at least one of information about the protection operation of the driving circuit based on an output from the logic operator, and temperature information based on an output from the temperature sensor, and determine an output based on a variation in the voltage of the pin caused by the main control circuit.

According to an embodiment, the bi-directional transmitter/receiver may include a pin connected with a main control circuit, a transistor connected with a first electrode to the pin, a Schmitt trigger which determines an output according to a voltage of the pin, and a temperature sensor which is connected to the pin, and which senses temperature and outputs temperature information to the pin.

The bi-directional transmitter/receiver may additionally include a fault determiner which turns on the transistor in accordance with an input to activate protection operation.

Embodiments provide a bi-directional transmitter/receiver which can sense the temperature of a package, transmit internal temperature information, and receive an external control signal, without causing price rise, and a driving circuit having the same.

BRIEF DESCRIPTION OF THE DRAWINGS

FIG. 1 is a diagram illustrating a bi-directional transmitter/receiver according to an embodiment, and a driving circuit having the same.

DETAILED DESCRIPTION OF THE EMBODIMENTS

Hereinbelow, embodiments of the present disclosure will be explained in detail with reference to the accompanied drawings to enable those skilled in the art to easily implement the same. However, the present disclosure is not limited to the embodiments disclosed herein, but can be implemented in a variety of different configurations. To further elucidate the present disclosure, illustrations of elements that are irrelevant to the description are omitted in the drawings, and similar elements are referred to by the similar reference numerals throughout the description.

Throughout the description, when an element is stated as being "connected" to another element, this encompasses not only "direct connection", but also "electrical connection" which may be made via yet another element interposed in between. Further, when an element is stated as "comprising" another element, unless specified to the contrary, this is to be interpreted as being open to addition of yet another element(s), rather than foreclosing the same.

FIG. 1 is a diagram illustrating a bi-directional transmitter/receiver according to an embodiment, and a driving circuit having the same.

As illustrated in FIG. 1, the driving circuit 100 generates a gate voltage HO and a gate voltage LO to control switching operation of a high side switch M1 and a low side switch M2. As illustrated in FIG. 1, the driving circuit 100 may include eleven pins 1 to 11, although embodiments are not limited thereto. The switch M1 and the switch M2 may be implemented as any of IGBT and MOSFET.

The driving circuit 100 includes a high side gate driver 110, a low side gate driver 115, a comparator 120, an overcurrent detector (CSC) 125, an under voltage lockout (UVLO) 130, a thermal shutdown (TSD) 135, two logic operators 140, 165, a timer 145, a fault determiner 150, a Schmitt trigger 155, a temperature sensor 160, and five transistors T1 to T5.

As illustrated in FIG. 1, the bi-directional transmitter/receiver 200 may be configured with the defect determiner 150, the Schmitt trigger 155, the temperature sensor 160 and the transistor T5, but embodiments are not limited thereto.

The pin 1 is connected to an output OUT through a capacitor C1, and voltage VB is inputted to the driving circuit through the pin 1. The source of the transistor T1 is connected to the pin 1, and the drain of the transistor T1 and the drain of the transistor T2 are connected to the pin 2, and the source of the transistor T2 is connected to the pin 3. Voltage VB is inputted through the pin 1, the gate voltage HO is outputted through the pin 2, and through the pin 3, the voltage VS of the output OUT is connected.

The source of the transistor T3 is connected to the pin 4, and the drain of the transistor T4 and the drain of the transistor T5 are connected to the pin 5, and the source of the transistor T5 is connected to the pin 6. Voltage VDD is supplied through the pin 4, the gate voltage LO is outputted through the pin 5, and the pin 6 is connected to the ground.

The voltage VP is connected to the collector of the switch M1, the emitter of the switch M1 and the collector of the switch M2 are connected to the output OUT, and the emitter of the switch M2 is connected to the ground. The gate of the switch M1 is connected to the pin 2 and receives the voltage HO as an input, and the gate of the switch M2 is connected to the pin 5 and receives the voltage LO as an input.

The information is transmitted and received between the driving circuit 100 and a main chip (MCU) 20 which controls a power supply device (not illustrated), through the pin 7 to which the bi-directional transmitter/receiver 200 is connected. The driving circuit 100 and the MCU 20 operate according to the voltage of the pin 7, while controlling the voltage of the pin 7.

For example, the voltage of the pin 7 may be dropped to the ground level, when the driving circuit 100 activates protection operation. The MCU 20 may then detect that the protection operation of the driving circuit 100 is activated, based on the voltage of the pin 7. Further, the pin 7, which is connected to the temperature sensor 160, can change the level thereof according to the result of temperature sensing at the temperature sensor 160. The MCU 20 may then sense a change in the temperature based on the voltage of the pin 7. The MCU 20 may then control the voltage of the pin 7 to supply a signal to shut down the driving circuit 100. As will be described below, the operation of the driving circuit 100 may be stopped by controlling the voltage of the pin 7 to cause the output of the Schmitt trigger 155 to be high level.

Hereinbelow, for convenience of explanation, the information supplied from the driving circuit 100 to the MCU 20 will be referred to as a signal S1, and the information supplied from the MCU 20 to the driving circuit 100 will be referred to as a signal S2.

The high side gate driver 110 controls the gate voltage HO by switching the transistor T1 and the transistor T2 according to the signal HIN inputted through the pin 11. For example, the gate voltage HO may become high level and the switch M1 may be turned on, when the high side gate driver 110 turns on the transistor T1 according to a rising edge of the signal HIN. The gate voltage HO may become low level and the switch M1 may be turned off, when the high side gate driver 110 turns on the transistor T2 according to a falling edge of the signal HIN.

The low side gate driver 115 controls the gate voltage LO by switching the transistor T3 and the transistor T4 according to the signal LIN inputted through the pin 10. For example, the gate voltage LO may become high level and the switch M2 may be turned on, when the low side gate driver 115 turns on the transistor T3 according to a rising edge of the signal LIN. The gate voltage LO may become low level and the switch M2 may be turned off, when the low side gate driver 115 turns on the transistor T4 according to a falling edge of the signal LIN.

The first and low side gate drivers 110, 115 may turn off the switching operation of the switch M1 and the switch M2 according to a main fault signal FS. For example, the first and low side gate drivers 110, 115 may be synchronized with the rising edge of the main fault signal FS and turn off the switch M1 and the switch M2 by turning on the transistors T2, T4.

The comparator 120 outputs a result of comparing the reference voltage Vref with a voltage VCS inputted through the pin 9. The voltage VCS corresponds to the currents flowing to the ground, and the comparator 120 may be configured to detect short. For example, when the voltage VCS inputted to a non-inverting terminal (+) is higher than the reference voltage Vref, a high level is outputted. A low level is outputted in the opposite situation. When short occurs, the voltage VCS can exceed the reference voltage Vref.

The CSC 125 may detect the short based on the output from the comparator 120 and generate an output to activate the protection operation. For example, when the output from the comparator 120 becomes high level, the CSC 125 may generate a high-level pulse and output the same to the logic operator 140.

The UVLO 130 may sense the voltage VDD and generate an output to activate the protection operation when the voltage VDD is lowered. For example, the UVLO 130 may generate a high-level pulse and output the same to the logic operator 140 to block low voltage, when the voltage VDD falls below a predetermined reference voltage.

The TSD 135 may sense temperature and generate an output to activate the protection operation, when the sensed temperature is high. For example, the TSD 135 may generate a high-level pulse and output the same to the logic operator 140 to block heat, when the sensed temperature is higher than a predetermined temperature.

As explained above, the configuration of the UVLO 130, the CSC 125 and the TSD 135 may be employed to activate the protection operation, but embodiments are not limited thereto.

According to an embodiment, the logic operator 140 determines an output according to OR operation. Accordingly, a signal to activate the protection operation is outputted, when at least one output from the UVLO 130, the CSC 125 and the TSD 135 is a high-level pulse.

The timer 145 may be synchronized at a time point when the output from the logic operator 140 is enabled to a level that activates the protection operation, to generate a fault signal FS1 that has an enable level for a predetermined time period. At this time, the predetermined time period may be set in accordance with the capacitor C2 which is connected through the pin 8.

For example, the timer 145 may be synchronized with a rising edge of an output from the logic operator 140, and generate a fault signal FS1 having a high level for a predetermined time period.

The fault determiner 150 may generate a gate voltage VG which turns on the transistor T5 for the enable period of the fault signal FS1 received from the timer 145. For example, the fault determiner 150 generates a high-level gate voltage VG which turns on the transistor T5 for the high-level period of the fault signal FS1. The drain of the transistor T5 is connected to the pin 7, and the source of the transistor T5 is connected to the ground.

Note that the level of the signal S1 drops to the ground level and the MCU 20 activates the protection operation at the driving circuit 100, as the transistor T5 turns on.

The temperature sensor 160 is connected between the pin 7 and the ground and may be configured as a CMOS circuit. The temperature sensor 160 can determine a voltage level for the pin 7, because the temperature sensor 160 senses the temperature and generates an output according to the sensed result. The MCU 20 can sense the temperature of the driving circuit 100 according to the level of the signal S1.

As the input of the Schmitt trigger 155 is connected to the pin 7, the output is determined according to the voltage of the pin 7 and outputted. For example, in response to variation in voltage of the pin 7, the Schmitt trigger 155 outputs high level if the voltage of the pin 7 is higher than a specific voltage, while the Schmitt trigger 155 outputs low level if the voltage of the pin 7 is equal to or lower than the specific voltage.

Specifically, the voltage of the pin 7 while the transistor T5 is in turn-off state is fixed, determined by the signal S2, or determined according to the output from the temperature sensor 160. For example, the voltage of the pin 7 may be determined by the signal S2, in which case in response to variation in the level of the signal S2, the Schmitt trigger 155 outputs high level if the signal S2 is equal to or higher than a specific voltage, while the Schmitt trigger 155 outputs low level if the signal S2 is equal to or lower than the specific voltage.

When sensing abnormality in the power supply device and shutting down the driving circuit 100, the MCU 20 may increase the level of the signal S2 to a voltage higher than the specific voltage and transmit the same to the driving circuit 100. The Schmitt trigger 155 then outputs high level. Further, the MCU 20 may control the driving circuit 100 based on the temperature information transmitted from the temperature sensor 160. For example, separately from the TSD 135, a signal S2 to shut down the driving circuit 100 is generated when the temperature sensed at the temperature sensor 160 exceeds a predetermined temperature. At this time, the predetermined temperature may be set or modified by a user.

The logic operator 165 generates a main fault signal FS according to the fault signal FS1 and an output from the Schmitt trigger 155. The logic operator 165, which is an OR operator, generates a high-level main fault signal FS, when at least one of the fault signal FS1 and the output from the Schmitt trigger 155 is high level.

Referring to FIG. 1, the bi-directional transmitter/receiver 200, which is realized with the fault determiner 150 to control switching operation of the transistor T5 and the Schmitt trigger 155, performs bi-directional transmission and reception with the MCU 20 through one pin 7. Further, in an embodiment, the bi-directional transmitter/receiver 200 does not need a separate temperature sensing circuit (e.g., NTC thermistor) and a separate pin to connect the MCU 20 with the temperature sensing circuit, because the bi-directional transmitter/receiver 200 additionally includes the temperature sensor 160.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

DESCRIPTION OF SYMBOLS

20: MCU
100: Driving circuit
200: Bi-directional transmitter/receiver

What is claimed is:

1. A method of operation of a driving circuit, the method comprising:
  receiving a first signal on a first pin of the driving circuit, the first signal being received from a main control circuit;
  determining an output of a Schmitt trigger according to a voltage of the first signal on the first pin;
  sensing a temperature of the driving circuit to generate a temperature information; and
  transmitting the temperature information to the main control circuit by outputting the temperature information on the first pin.

2. The method of claim 1, further comprising:
  turning on a transistor that has an electrode connected to the first pin in response to a fault condition.

3. The method of claim 1, further comprising:
  receiving a second signal on the first pin, the second signal being received from the main control circuit; and
  shutting down the driving circuit in response to receiving the second signal.

4. The method of claim 3, wherein shutting down the driving circuit includes grounding the first pin.

5. The method of claim 1, further comprising:
  transmitting a high-side gate signal on a second pin of the driving circuit to control a switching operation of a high-side transistor; and
  transmitting a low-side gate signal on a third pin of the driving circuit to control a switching operation of a low-side transistor.

6. A method of operation of a driving circuit, the method comprising:
  controlling a switching operation of one or more switches;
  receiving temperature information from a temperature sensor;
  controlling a voltage of a first pin of the driving circuit according to at least one of information about a protection operation of the driving circuit and the temperature information; and
  determining an output based on a variation of the voltage of the first pin caused by an external main control circuit that communicates with the driving circuit at least by way of the first pin.

7. The method of claim 6, wherein controlling a switching operation of the one or more switches comprises:
  transmitting a high-side drive signal on a second pin of the driving circuit to control a high-side transistor; and
  transmitting a low-side drive signal on a third pin of the driving circuit to control a low-side transistor.

8. The method of claim 6, further comprising:
  transmitting the temperature information to the main control circuit by way of the first pin.

9. The method of claim 6, further comprising:
  grounding the first pin to indicate activation of a protection operation of the driving circuit.

10. The method of claim 6, further comprising:
  shutting down the driving circuit in response to receiving a shutdown signal from the main control circuit on the first pin.

* * * * *